United States Patent
Yao

(10) Patent No.: US 10,439,093 B2
(45) Date of Patent: Oct. 8, 2019

(54) ANTENNA-ASSISTED PHOTOVOLTAIC GRAPHENE DETECTORS

(71) Applicant: Yu Yao, Chandler, AZ (US)

(72) Inventor: Yu Yao, Chandler, AZ (US)

(73) Assignee: Arizon Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/488,114

(22) Filed: Apr. 14, 2017

(65) Prior Publication Data

US 2017/0301819 A1  Oct. 19, 2017

Related U.S. Application Data

(60) Provisional application No. 62/323,133, filed on Apr. 15, 2016.

(51) Int. Cl.
| | |
|---|---|
| *H01L 31/11* | (2006.01) |
| *H01L 31/112* | (2006.01) |
| *H01L 31/028* | (2006.01) |
| *H01L 31/0224* | (2006.01) |
| *H01L 31/00* | (2006.01) |

(52) U.S. Cl.
CPC .......... *H01L 31/1126* (2013.01); *H01L 31/00* (2013.01); *H01L 31/028* (2013.01); *H01L 31/022408* (2013.01); *H01L 31/1129* (2013.01)

(58) Field of Classification Search
CPC .............................. H01L 31/11; H01L 31/1126
See application file for complete search history.

(56) References Cited

U.S. PATENT DOCUMENTS

| | | | |
|---|---|---|---|
| 8,554,022 B1* | 10/2013 | Hochberg | H01L 29/66977 257/21 |
| 9,293,627 B1* | 3/2016 | Beechem, III | H01L 29/1606 |
| 9,297,638 B1* | 3/2016 | Dyer | G01B 9/02001 |
| 2012/0068158 A1* | 3/2012 | Komiyama | H01L 27/14649 257/24 |
| 2013/0026442 A1* | 1/2013 | Kim | H01L 31/028 257/9 |

(Continued)

OTHER PUBLICATIONS

K. F. Mak, L. Ju, F. Wang, and T. F. Heinz, "Optical spectroscopy of graphene: From the far infrared to the ultraviolet," *Solid State Communications*, vol. 152, pp. 1341-1349, Aug. 2012.

(Continued)

*Primary Examiner* — Fazli Erdem
(74) *Attorney, Agent, or Firm* — Fish & Richardson P.C.

(57) ABSTRACT

A photovoltaic photodetector includes a substrate, a graphene layer, and a dielectric layer positioned between the substrate and the graphene layer. One or more first antenna electrodes includes a first metal in direct contact with the graphene layer. One or more second antenna electrodes includes a second metal in direct contact with the graphene layer. The first and second metals have different work functions. A drain electrode is electrically coupled to the one or more first antenna electrodes, and a source electrode is electrically coupled to the one or more second antenna electrodes. The photovoltaic photodetector can be configured to be operable over a wavelength region of 2 μm to 24 μm and has a response time of 10 ns or less.

18 Claims, 16 Drawing Sheets

(56) References Cited

U.S. PATENT DOCUMENTS

| | | | | |
|---|---|---|---|---|
| 2014/0021446 | A1* | 1/2014 | Lee | H01L 29/4908 257/29 |
| 2014/0224989 | A1* | 8/2014 | Long | G02F 1/0126 250/338.4 |
| 2014/0346357 | A1* | 11/2014 | Jarrahi | H01L 31/09 250/338.4 |
| 2015/0162993 | A1* | 6/2015 | Akyildiz | H04B 10/90 257/76 |
| 2015/0369660 | A1* | 12/2015 | Yu | G02B 27/0075 250/338.4 |
| 2015/0369928 | A1* | 12/2015 | Reese | G01T 1/2018 250/362 |
| 2016/0111180 | A1* | 4/2016 | Joo | H01B 1/04 428/408 |
| 2016/0161340 | A1* | 6/2016 | Colli | G01J 5/0837 250/338.3 |
| 2016/0172527 | A1* | 6/2016 | Beechem, III | H01L 31/0232 257/294 |
| 2017/0227797 | A1* | 8/2017 | Long | G02F 1/0136 |

OTHER PUBLICATIONS

S. Bae, H. Kim, Y. Lee, X. F. Xu, J. S. Park, Y. Zheng, et al., "Roll-to-roll production of 30-inch graphene films for transparent electrodes," *Nature Nanotechnology*, vol. 5, pp. 574-578, Aug. 2010.

F. N. Xia, T. Mueller, Y. M. Lin, A. Valdes-Garcia, and P. Avouris, "Ultrafast graphene photodetector," *Nature Nanotechnology*, vol. 4, pp. 839-843, Dec. 2009.

T. Mueller, F. N. A. Xia, and P. Avouris, "Graphene photodetectors for high-speed optical communications," *Nature Photonics*, vol. 4, pp. 297-301, May 2010.

A. Urich, K. Unterrainer, and T. Mueller, "Intrinsic Response Time of Graphene Photodetectors," *Nano Letters*, vol. 11, pp. 2804-2808, Jul. 2011.

S. Winnerl, M. Orlita, P. Plochocka, P. Kossacki, M. Potemski, T. Winzer, et al., "Carrier Relaxation in Epitaxial Graphene Photoexcited Near the Dirac Point," *Physical Review Letters*, vol. 107, Nov. 28, 2011.

J. M. Dawlaty, S. Shivaraman, M. Chandrashekhar, F. Rana, and M. G. Spencer, "Measurement of ultrafast carrier dynamics in epitaxial graphene," *Applied Physics Letters*, vol. 92, Jan. 28, 2008.

Y. Yao, M. A. Kats, P. Genevet, N. Yu, Y. Song, J. Kong, et al., "Broad electrical tuning of graphene-loaded plasmonic antennas," *Nano letters*, vol. 13, pp. 1257-1264, 2013.

Y. Yao, M. A. Kats, R. Shankar, Y. Song, J. Kong, M. Loncar, et al., "Wide wavelength tuning of optical antennas on graphene with nanosecond response time," *Nano letters*, vol. 14, pp. 214-219, 2013.

Y. Yao, R. Shankar, M. A. Kats, Y. Song, J. Kong, M. Loncar, et al., "Electrically Tunable Metasurface Perfect Absorbers for Ultrathin Mid-Infrared Optical Modulators," *Nano Letters*, vol. 14, pp. 6526-6532, 2014.

Y. Yao, R. Shankar, P. Rauter, Y. Song, J. Kong, M. Loncar, et al., "High-responsivity mid-infrared graphene detectors with antenna-enhanced photocarrier generation and collection," *Nano letters*, vol. 14, pp. 3749-3754, 2014.

C. Dean, A. Young, I. Meric, C. Lee, L. Wang, S. Sorgenfrei, et al., "Boron nitride substrates for high-quality graphene electronics," *Nature nanotechnology*, vol. 5, pp. 722-726, 2010.

W. Liu, S. Kraemer, D. Sarkar, H. Li, P. M. Ajayan, and K. Banerjee, "Controllable and rapid synthesis of high-quality and large-area Bernal stacked bilayer graphene using chemical vapor deposition," *Chemistry of Materials*, vol. 26, pp. 907-915, 2013.

S. Najmaei, Z. Liu, W. Zhou, X. Zou, G. Shi, S. Lei, et al., "Vapour phase growth and grain boundary structure of molybdenum disulphide atomic layers," *Nature materials*, vol. 12, pp. 754-759, 2013.

Z. Liu, Y. Gong, W. Zhou, L. Ma, J. Yu, J. C. Idrobo, et al., "Ultrathin high-temperature oxidation-resistant coatings of hexagonal boron nitride," *Nature communications*, vol. 4, 2013.

Z. Liu, L. Song, S. Zhao, J. Huang, L. Ma, J. Zhang, et al., "Direct growth of graphene/hexagonal boron nitride stacked layers," *Nano letters*, vol. 11, pp. 2032-2037, 2011.

L. Ci, L. Song, C. Jin, D. Jariwala, D. Wu, Y. Li, et al., "Atomic layers of hybridized boron nitride and graphene domains," *Nature materials*, vol. 9, pp. 430-435, 2010.

Z. Liu, L. Ma, G. Shi, W. Zhou, Y. Gong, S. Lei, et al., "In-plane heterostructures of graphene and hexagonal boron nitride with controlled domain sizes," *Nature nanotechnology*, vol. 8, pp. 119-124, 2013.

Y. Yao, M. Kats, P. Genevet, N. Yu, Y. Song, J. Kong, et al., "Broad electrical tuning of graphene-loaded plasmonic antennas," *Nano letters*, 2013.

G. Giovannetti, P. Khomyakov, G. Brocks, V. Karpan, J. Van den Brink, and P. Kelly, "Doping graphene with metal contacts," *Physical Review Letters*, vol. 101, p. 026803, 2008.

T. Mueller, F. Xia, and P. Avouris, "Graphene photodetectors for high-speed optical communications," *Nature Photonics*, vol. 4, pp. 297-301, 2010.

M. P. Levendorf, C.-J. Kim, L. Brown, P. Y. Huang, R. W. Havener, D. A. Muller, et al., "Graphene and boron nitride lateral heterostructures for atomically thin circuitry," *Nature*, vol. 488, pp. 627-632, 2012.

A. Mishchenko, J. Tu, Y. Cao, R. Gorbachev, J. Wallbank, M. Greenaway, et al., "Twist-controlled resonant tunnelling in graphene/boron nitride/graphene heterostructures," *Nature nanotechnology*, vol. 9, pp. 808-813, 2014.

N. Myoung, K. Seo, S. J. Lee, and G. Ihm, "Large current modulation and spin-dependent tunneling of vertical graphene/MoS2 heterostructures," *Acs Nano*, vol. 7, pp. 7021-7027, 2013.

T. Niu and A. Li, "From two-dimensional materials to heterostructures," *Progress in Surface Science*, vol. 90, pp. 21-45, Feb. 2015.

Z. Liu, Y. J. Gong, W. Zhou, L. L. Ma, J. J. Yu, J. C. Idrobo, et al., "Ultrathin high-temperature oxidation-resistant coatings of hexagonal boron nitride," *Nature Communications*, vol. 4, Oct. 2013.

Y. Gong, G. Shi, Z. Zhang, W. Zhou, J. Jung, W. Gao, et al., "Direct chemical conversion of graphene to boron- and nitrogen- and carbon-containing atomic layers," *Nature communications*, vol. 5, 2014.

Y. Yao, R. Shankar, M. A. Kats, Y. Song, J. Kong, M. Loncar, et al., "Electrically Tunable Metasurface Perfect Absorbers for Ultrathin Mid-Infrared Optical Modulators," *Nano Letters*, 2014.

A. Yariv, "Critical coupling and its control in optical waveguide-ring resonator systems," *Ieee Photonics Technology Letters*, vol. 14, pp. 483-485, Apr. 2002.

M. A. Kats, R. Blanchard, P. Genevet, and F. Capasso, "Nanometre optical coatings based on strong interference effects in highly absorbing media," *Nature Materials*, vol. 12, pp. 20-24, Jan. 2013.

M. A. Kats, D. Sharma, J. Lin, P. Genevet, R. Blanchard, Z. Yang, et al., "Ultra-thin perfect absorber employing a tunable phase change material," *Applied Physics Letters*, vol. 101, Nov. 26, 2012.

M. A. Kats, R. Blanchard, S. Ramanathan, and F. Capasso, "Thin-Film Interference in Lossy, Ultra-Thin Layers," *Optics and Photonics News*, vol. 25, pp. 44-47, 2014.

H. Dotan, O. Kfir, E. Sharlin, O. Blank, M. Gross, I. Dumchin, et al., "Resonant light trapping in ultrathin films for water splitting," *Nature Materials*, vol. 12, pp. 158-164, Feb. 2013.

N. Yu and F. Capasso, "Flat optics with designer metasurfaces," *Nature materials*, vol. 13, pp. 139-150, 2014.

F. Aieta, P. Genevet, M. A. Kats, N. Yu, R. Blanchard, Z. Gaburro, et al., "Aberration-free ultrathin flat lenses and axicons at telecom wavelengths based on plasmonic metasurfaces," *Nano letters*, vol. 12, pp. 4932-4936, 2012.

F. Aieta, M. A. Kats, P. Genevet, and F. Capasso, "Multiwavelength achromatic metasurfaces by dispersive phase compensation," *Science*, vol. 347, pp. 1342-1345, 2015.

M. Khorasaninejad, F. Aieta, P. Kanhaiya, M. A. Kats, P. Genevet, D. Rousso, et al., "Achromatic metasurface lens at telecommunication wavelengths," *Nano letters*, vol. 15, pp. 5358-5362, 2015.

(56) References Cited

OTHER PUBLICATIONS

G. Giovannetti, P. A. Khomyakov, G. Brocks, V. M. Karpan, J. van den Brink, and P. J. Kelly, "Doping graphene with metal contacts," *Physical Review Letters*, vol. 101, Jul. 11, 2008.

I. Meric, M. Y. Han, A. F. Young, B. Ozyilmaz, P. Kim, and K. L. Shepard, "Current saturation in zero-bandgap, top-gated graphene field-effect transistors," *Nature nanotechnology*, vol. 3, pp. 654-659, 2008.

L. Britnell, R. Gorbachev, A. Geim, L. Ponomarenko, A. Mishchenko, M. Greenaway, et al., "Resonant tunnelling and negative differential conductance in graphene transistors," *Nature communications*, vol. 4, p. 1794, 2013.

Y. Yao, *Quantum cascade lasers with extended spectral range and tunability*, 2011.

G. Konstantatos, M. Badioli, L. Gaudreau, J. Osmond, M. Bernechea, F. P. G. de Arquer, et al., "Hybrid graphene-quantum dot phototransistors with ultrahigh gain," *Nature nanotechnology*, vol. 7, pp. 363-368, 2012.

P. Giannozzi, S. Baroni, N. Bonini, M. Calandra, R. Car, C. Cavazzoni, et al., "Quantum Espresso: a modular and open-source software project for quantum simulations of materials," *Journal of Physics: Condensed Matter*, vol. 21, p. 395502, 2009.

M. Saraniti and S. M. Goodnick, "Hybrid fullband cellular automaton/ Monte Carlo approach for fast simulation of charge transport in semiconductors," *Electron Devices, IEEE Transactions on*, vol. 47, pp. 1909-1916, 2000.

R. Hathwar, M. Saraniti, and S. Goodnick, "Full band Monte Carlo simulation of In 0.7 Ga 0.3 As junctionless nanowire field effect transistors," in *Nanotechnology (IEEE-NANO), 2014 IEEE 14th International Conference on*, 2014, pp. 645-649.

R. Shishir, D. Ferry, and S. Goodnick, "Room temperature velocity saturation in intrinsic graphene," in *Journal of Physics: Conference Series*, 2009, p. 012118.

S.-J. Han, A. V. Garcia, S. Oida, K. A. Jenkins, and W. Haensch, "Graphene radio frequency receiver integrated circuit," *Nature communications*, vol. 5, 2014.

Y.-M. Lin, A. Valdes-Garcia, S.-J. Han, D. B. Farmer, I. Meric, Y. Sun, et al., "Wafer-scale graphene integrated circuit," *Science*, vol. 332, pp. 1294-1297, 2011.

\* cited by examiner

US 10,439,093 B2

ANTENNA-ASSISTED PHOTOVOLTAIC GRAPHENE DETECTORS

CROSS-REFERENCE TO RELATED APPLICATION

This application claims the benefit of U.S. Patent Application Ser. No. 62/323,133 entitled "ANTENNA-ASSISTED PHOTOVOLTAIC GRAPHENE DETECTORS" and filed on Apr. 15, 2016, which is incorporated by reference herein in its entirety.

TECHNICAL FIELD

The present invention relates to high-speed mid-infrared (MIR) photodetectors with high sensitivity at room temperature.

BACKGROUND

High-speed MIR photodetectors with high sensitivity are needed for many applications, including MIR hyper-spectral imaging, biomedical sensing, environment monitoring, and astronomy. Yet, it remains a great challenge to realize sensitive and cost-effective MIR photodetectors with short response time (nanoseconds or picoseconds) at room temperature, especially in the longer wavelength range (>8 μm), due to the fundamental limitations in current detection technologies and their lack of compatibility with complementary metal-oxide-semiconductor (CMOS) circuits.

SUMMARY

Graphene-based CMOS-compatible photodetectors operable over the MIR wavelength region (i.e., 2-24 μm) with room temperature operation, high sensitivity ($D^* > 2 \times 10^8$ cm-Hz$^{1/2}$/W), short response time (nanoseconds), and ultra-compact size (area: 10 μm×10 μm, thickness: <1 μm) are described. These photodetectors enhance the optical absorption in graphene to close to 90% and realize close to unity photocarrier collection. In addition, detector noise due to dark current is effectively eliminated, and response time can be as short as sub-nanosecond.

Thus, particular implementations have been described. Variations, modifications, and enhancements of the described implementations and other implementations can be made based on what is described and illustrated. In addition, one or more features of one or more implementations may be combined. The details of one or more implementations and various features and aspects are set forth in the accompanying drawings, the description, and the claims below.

DETAILED DESCRIPTION

The MIR devices described herein are graphene hybrid/heterostructure photodetectors (GHPD) based on two-dimensional semiconductor materials and plasmonic metasurfaces including metallic optical antenna arrays. These MIR photodetectors, fabricated at wafer scale on silicon substrates, operate at room temperature with high sensitivity ($D^* > 2 \times 10^8$ cm-Hz$^{1/2}$/W), short response time (nanoseconds), and ultra-compact size (area: 10 μm×10 μm, thickness: <1 μm). These MIR photodetectors are also compatible with CMOS technology, allowing low-cost, large-scale production of MIR imaging systems at room temperature. As described herein, plasmonic metasurface structures are designed to realize up to 90% optical absorption in graphene over the MIR spectral region from 8 μm to 12 μm.

Figure 1A:
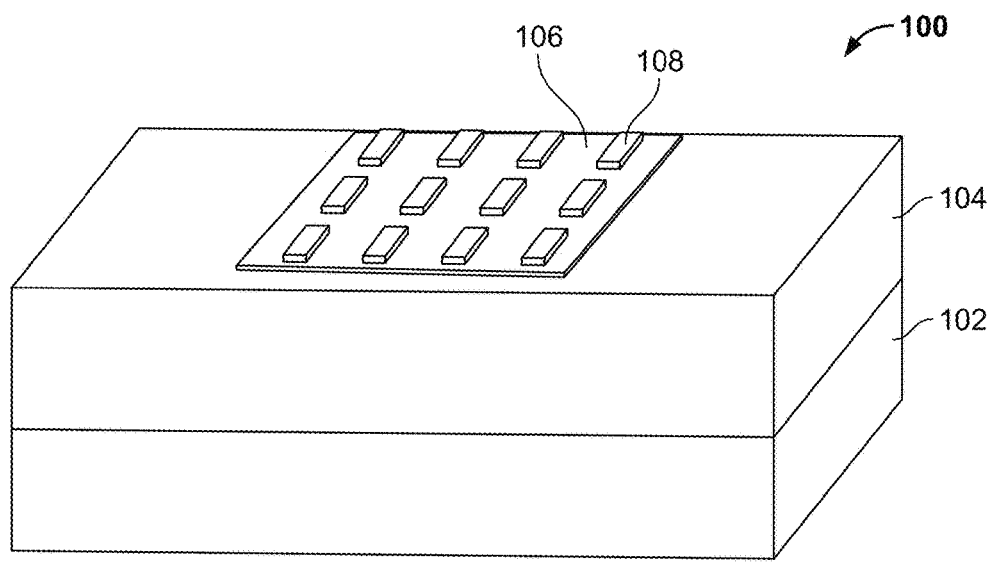
FIG. 1A depicts an antenna-assisted photovoltaic graphene detector.

FIG. 1A depicts antenna-assisted photovoltaic graphene detector 100 with metal layer 102, dielectric layer 104, and graphene heterostructure 106. Graphene heterostructure 106 typically includes one or more layers of graphene and one or more two-dimensional semiconductor barrier layers. Each layer of graphene may be formed over a two-dimensional semiconductor barrier layer, such as boron nitride (BN) or molybdenum disulfide (MoS$_2$). In some implementations, graphene heterostructure 106 includes two or three graphene layers, each separated by a barrier layer, with a barrier layer or a graphene layer in contact with dielectric layer 104. In some implementations, graphene heterostructure 106 includes a barrier layer sandwiched between two layers of graphene, and a graphene layer is in contact with dielectric layer 104. The graphene heterostructures may be formed by methods including direct vapor phase growth or layer by layer transfer. In some examples, metal layer 102 includes aluminum, gold or other metals with high optical reflection. In some examples, dielectric layer 104 includes low loss materials such as aluminum oxide and silicon oxide. Arrays of antenna electrodes 108 may be formed by lithography (photolithography, nanoimprint lithography or electron beam lithography), metal deposition and lift-off on graphene heterostructure 106. In some implementations, arrays of antenna electrodes 108 are formed of one or more metals, including a layer of gold, silver, aluminum, or copper over a layer of titanium, palladium, or the like.

Figure 1B:
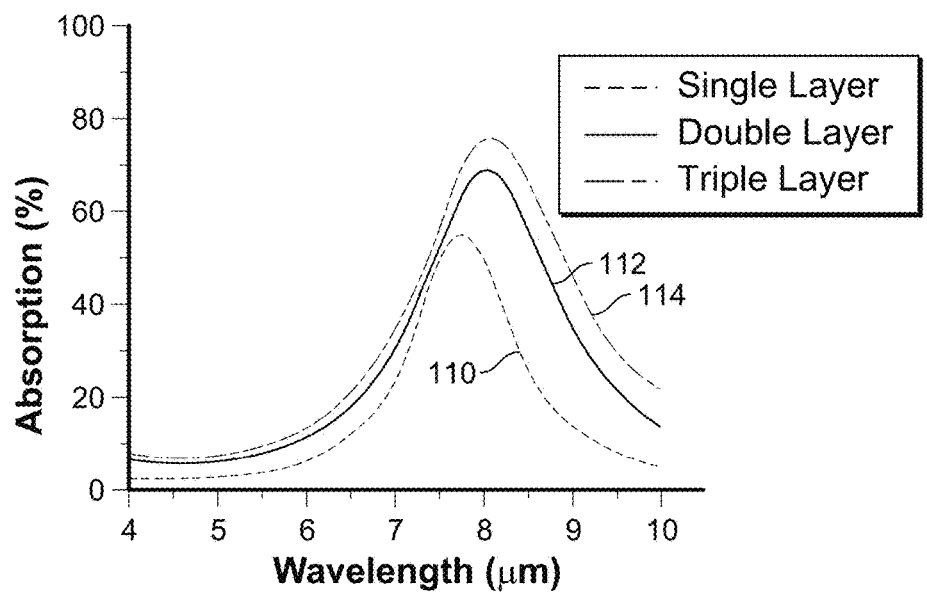
FIG. 1B shows optical absorption in single, double, and triple layer graphene with metasurface enhanced effects.

Plots 110, 112, and 114 in FIG. 1B show optical absorption (%) versus wavelength (μm) with full wave finite-difference time-domain (FDTD) simulation for antenna-assisted photovoltaic graphene detectors with one, two, and three layers of graphene, respectively, the layers of graphene sandwiching barrier layers. The antennas used in the metasurface device design are 1.2 μm, 200 nm wide, and 40 nm thick, and the gap between antenna electrodes is 100 nm. The dielectric spacer layer is 300 nm thick aluminum oxide. Plots 110, 112, and 114 demonstrate metasurface enhanced effects.

Figure 1C:
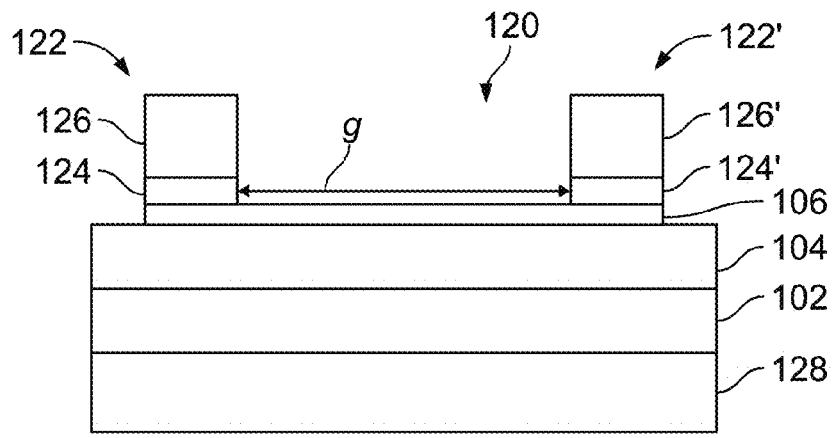
FIG. 1C depicts a cross section of the antenna-assisted photovoltaic graphene detector.
Figure 1C:
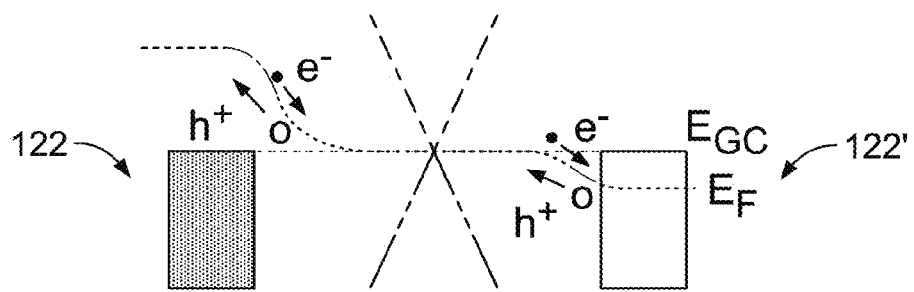

FIG. 1C depicts a cross section of antenna-assisted photovoltaic graphene detector 120 including metal layer 102, dielectric layer 104, and graphene heterostructure 106. Antenna electrodes 122, 122', formed on graphene heterostructure 106, are separated by a nanogap (graphene channel distance) or distance between antenna electrodes 122, 122' having length g. In some embodiments, at least one of antenna electrodes 122, 122' includes a single metal layer. In some embodiments, at least one of antenna electrodes 122, 122' includes first metal layer (contact layer) 124, 124', respectively, and second metal layer 126, 126', respectively. When antenna electrodes 122, 122' include two metal layers, first metal layers 124, 124' in antennas 122, 122', respectively, may be the same or different and second metal layers 126, 126' in antennas 122, 122', respectively, may be the same or different. First metal layers 122, 122' may each independently include palladium or titanium, or other pairs of metals with different working potentials. Second metal layers 126, 126' may each independently include gold, silver, aluminum, copper, or the like.

In some implementations, antenna electrode 122 includes first metal layer 124 formed of palladium and second metal layer 126 formed of gold, and antenna electrode 122' includes first metal layer 124' formed of titanium and second metal layer 126' formed of gold. In some implementations, antenna electrode 122 includes first metal layer 124 formed of palladium and second metal layer 126 formed of gold, and antenna electrode 122' includes first metal layer 124' formed of palladium and second metal layer 126' formed of gold. In some implementations, antenna-assisted photovoltaic graphene detector 120 is fabricated on silicon layer 128 in contact with metal layer 102. The inset to FIG. 1C depicts the built-in potential generated in the gap between antenna electrodes 122, 122' with different metal contact layers.

Figure 1D:
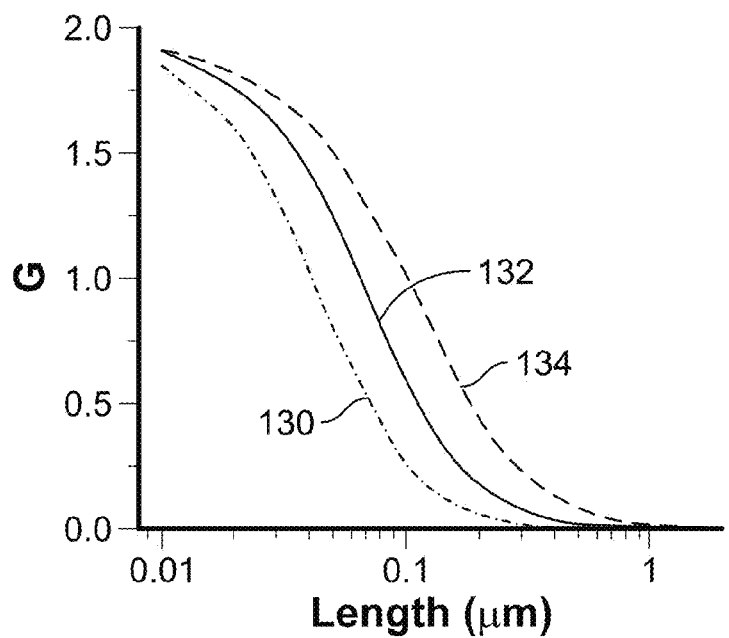
FIG. 1D shows calculated internal quantum efficiency of the antenna-assisted photovoltaic graphene detector as a function of antenna gap size for different carrier mobilities.

FIG. 1D shows plots 130, 132, and 134 of internal quantum efficiency of antenna-assisted photovoltaic graphene detector 120 as a function of antenna gap size (μm) for carrier mobilities of 1000 $cm^2$/Vs, 3000 $cm^2$/Vs, and 10,000 $cm^2$/Vs, respectively.

Figure 1E:
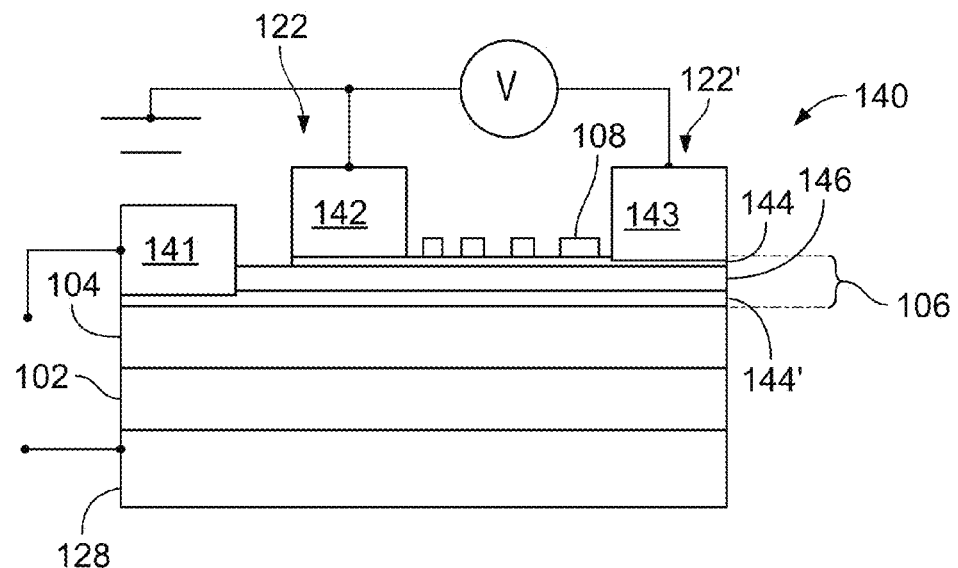
FIG. 1E depicts an antenna-assisted photovoltaic graphene detector.

FIG. 1E depicts antenna-assisted photovoltaic graphene detector 140 having silicon layer 128, metal layer 102, dielectric layer 104, graphene heterostructure 106, and array of antenna electrodes 108. In some implementations, antenna-assisted photovoltaic graphene detector 140 includes gate electrode 141, top drain electrode 142, and top source electrode 143. In some implementations, graphene heterostructure 106 includes graphene layers 144 and 144' separated by barrier layer 146. In some implementations, barrier layer 146 is formed of boron sulfide or molybdenum disulfide.

Figure 1F:
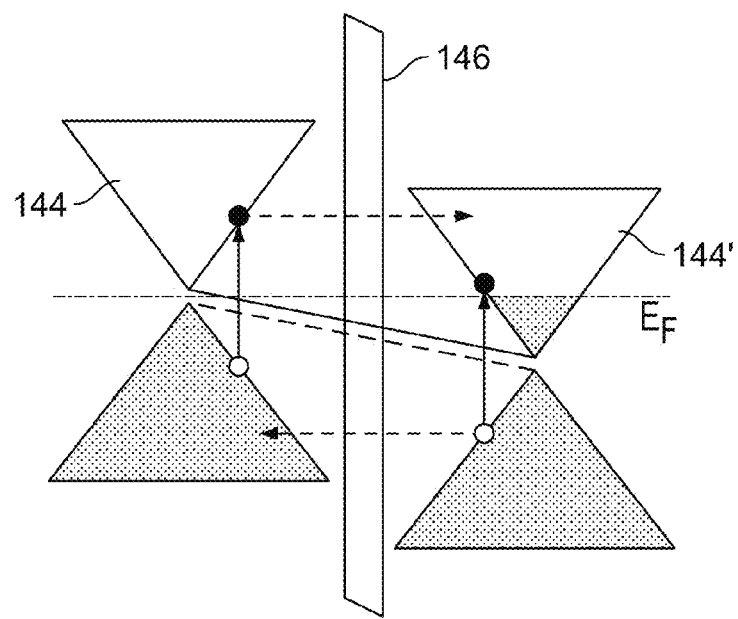
FIG. 1F depicts the band diagram of the graphene heterostructure.

FIG. 1F depicts a band diagram of antenna-assisted photovoltaic graphene detector 140, with graphene layers 144, 144' separated by barrier layer 146.

To achieve low noise metasurface-assisted graphene photodetectors with high photocarrier collection efficiency (e.g., close to 100%) at room temperature, antenna electrodes made of different metals (e.g., Pd and Ti) are patterned to create a built-in potential (e.g., ~0.1 V) across the nanogap (nanoscale antenna gap or channel length) g (e.g., ~100 nm) between antenna electrodes 122, 122', as depicted in FIG. 1C. Thus, a high electrical field (e.g., ~1 MV/m) may be created to efficiently collect photocarriers (e.g., close to 100%) even without external bias. The high photocarrier collection efficiency and low noise may be achieved simultaneously due at least in part to design considerations including: lack of external bias requirement for photon detection, leading to reduction or minimization of dark current; focus of light into the nanoscale antenna gap, leading to an ultra-small detector volume, which will further enhance signal to noise ratio, similar to using a lens to focus light onto a small detector; and the close spacing of antenna electrodes (e.g., <100 nm apart), which leads to a very short carrier transit time (e.g., $\tau_{tr}$~<1 ps). As such, a high photocarrier collection efficiency is achievable, despite a small band gap and short carrier recombination lifetime.

Calculations indicate that the internal quantum efficiency (defined as the ratio of the number of collected photocarriers to that of absorbed photons) increases as the graphene channel length between the antenna electrodes decreases, as shown in FIG. 1D. Efficiency may also improve as carrier mobility increases. In one example, the internal quantum efficiency approaches 100% for a 100 nm graphene channel length if the carrier mobility is about 10,000 $cm^2$/Vs. In some cases, the internal quantum efficiency may exceed 100% (e.g., when one photon generates one electron and one hole, both contributing to the photoresponse, since they have equally high carrier mobility).

Vertical tunneling in some graphene heterostructures (e.g., graphene/boron nitride/graphene or graphene/molybdenum disulfide/graphene) may be exploited to increase the photocarrier lifetime in graphene. Reference is made to FIGS. 1E and 1F, respectively, which depict an antenna-assisted photovoltaic graphene detector and a band structure of its graphene hetero structure, respectively. An electrical field across the barrier layer (e.g., boron nitride or molybdenum disulfide) is created and controlled by changing the Fermi levels (i.e., doping concentrations on both top and bottom graphene layers). The built-in electrical field can separate the photo-generated carriers via tunneling through the barrier layer. As a result, the carrier recombination lifetime is typically enhanced. Graphene heterostructures may be integrated with plasmonic metasurfaces (e.g., including arrays of antenna electrodes) to realize a photoconductive gain, typically provided that the carrier recombination lifetime in the top graphene layer is longer than the transit time across the graphene channel between the antenna electrodes. These devices are compatible with large-scale fabrication on silicon substrates, including wafer scale device fabrication on 8-inch silicon wafers.

Figure 2A:
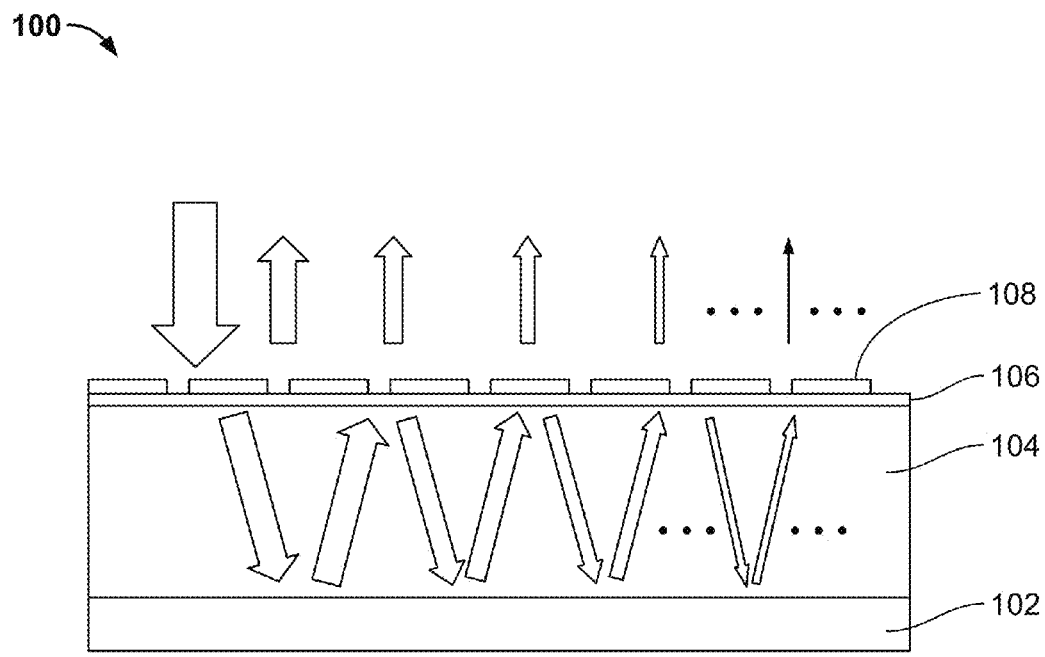
FIG. 2A depicts a cross section of a portion of the antenna-assisted photovoltaic graphene detector in FIG. 1A.

FIG. 2A depicts a cross section of a portion of antenna-assisted photovoltaic graphene detector 100, with metal layer 102, dielectric layer 104, graphene heterostructure 106, and array of antenna electrodes 108. The arrows indicate multiple reflected light waves in dielectric layer 104 when light incident upon detector 100 travels through interfaces at graphene heterostructure 106 and an interface between dielectric layer 104 and metal layer 102.

Figure 2B:
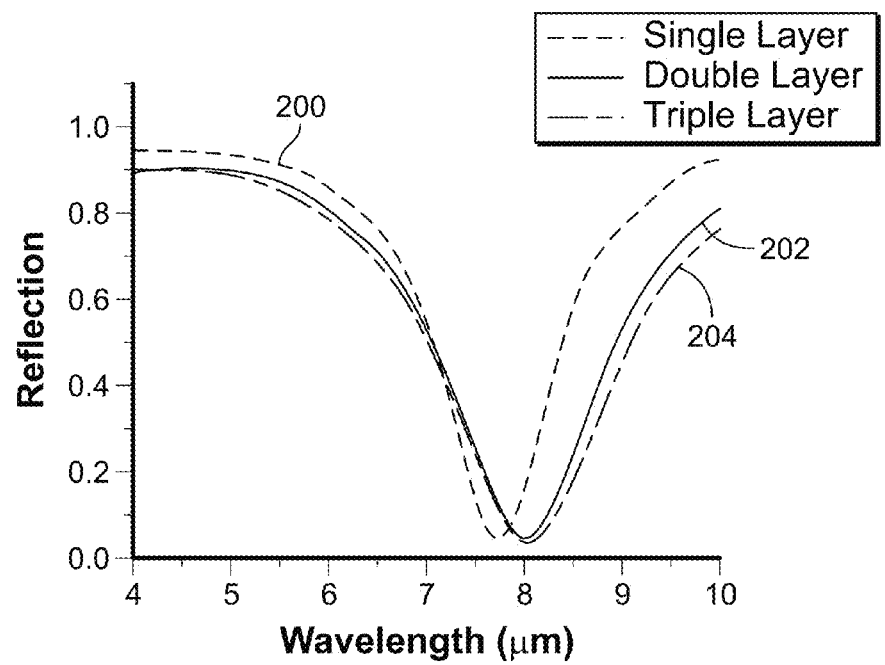
FIG. 2B shows full wave simulation results of reflection spectra of the antenna-assisted photovoltaic graphene detector with single layer and double layer graphene.

Plots 200, 202, and 204 in FIG. 2B show full wave simulation FDTD results of the reflection spectra of antenna-assisted photovoltaic graphene detectors having one, two, and three layers of graphene, respectively, separated by two-dimensional semiconductor barrier layers. The antenna-assisted photovoltaic graphene detector is designed for absorption at a wavelength of around 8 µm.

Figure 2C:
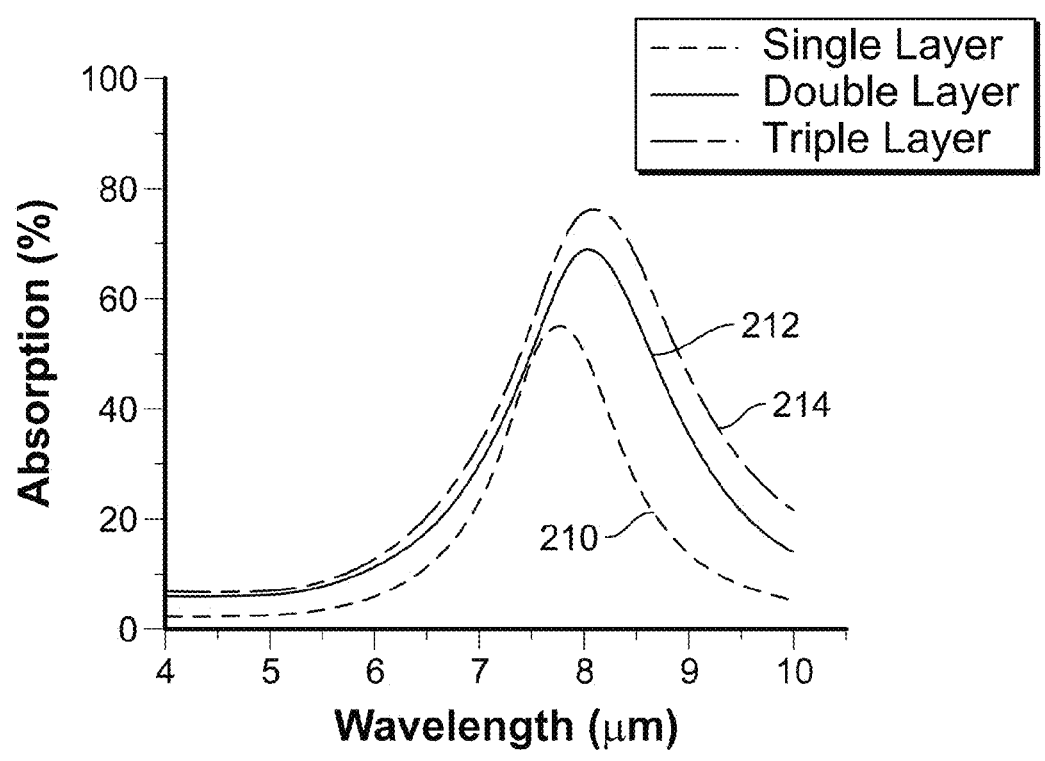
FIG. 2C shows full wave simulation results of the optical absorption in graphene for antenna-assisted photovoltaic graphene detector with single, double, and triple layer graphene.

The maximum absorption can be designed at different wavelengths by tailoring the dimensions of the antenna electrodes formed on the graphene heterostructure and the dielectric layer. More than 95% absorption can be realized at the cavity resonance wavelength. Near field distribution shows that light is highly focused in the nanogap between the antenna electrodes. Therefore, most of the photocarriers will be generated in the gap so that they will be collected very efficiently by the antenna electrodes via built-in potential. Plots 210, 212, and 214 in FIG. 2C show absorption (%) versus wavelength (µm) for antenna-assisted photovoltaic graphene detectors having one, two, and three layers of graphene, respectively, separated by two-dimensional semiconductor barrier layers. Based on the full wave simulation (FDTD), the optical absorption obtained in these antenna-assisted photovoltaic graphene detectors having single, double, and triple layer graphene is about 50%, 70%, or 80% respectively. The rest of the light is partially absorbed in the metallic structures and partially reflected back into free space. Even higher optical absorption can be achieved by optimizing the critical coupling condition and further enhancing the light-graphene interaction via engineering the antenna structures.

In graphene photoconductors, an external bias is typically necessary to collect photocarriers efficiently, which however, lead to high dark currents and thus high noise. Improvement of the photocarrier collection efficiency while minimizing the dark current is achieved with antenna-assisted photovoltaic graphene detectors to achieve highly sensitive graphene photodetectors.

Figure 3A:
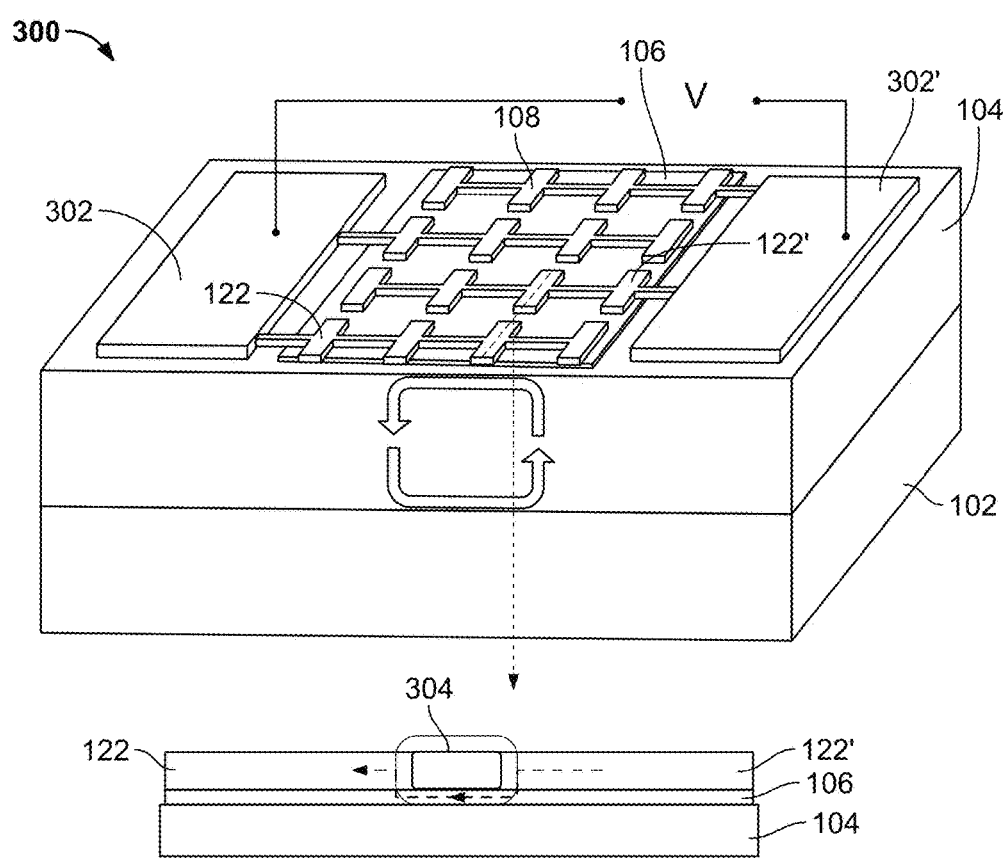
FIG. 3A depicts an antenna-assisted photovoltaic graphene detector.

FIG. 3A depicts antenna-assisted photovoltaic graphene detector 300 with metal layer 102, dielectric layer 104, and graphene heterostructure 106. Graphene heterostructure 106 includes a graphene layer formed on a barrier layer (e.g., boron nitride or molybdenum disulfide). Antenna electrodes 122, 122' are electrically coupled to drain electrode 302 and source electrode 302', respectively. The metal layer of antenna electrodes 122, 122' in contact with the graphene layer of graphene heterostructure 106 may be the same or different. In some implementations, antenna electrode 122 includes a layer of palladium in contact with the graphene layer and a layer of gold in contact with the palladium. In some implementations, antenna electrode 122' includes a layer of titanium in contact with the graphene layer and a layer of gold in contact with the titanium. In some implementations, antenna electrodes 122, 122' both include a layer of palladium in contact with the graphene layer and a layer of gold in contact with the palladium. In some implementations, titanium and palladium, or other pairs of metals with different work functions, may be used underneath the optical antennas (e.g., gold layer) to contact the graphene, thereby forming a built-in potential in the graphene across the nanogap without requiring applied bias along the channel, thereby allowing efficient collecting carriers without inducing dark current. The inset to FIG. 3A depicts a region with highly enhanced near field, and the dashed arrow indicates the flow of photocurrent across antenna gap 304 between antenna electrodes 122, 122' upon illumination with light.

Figure 3B:
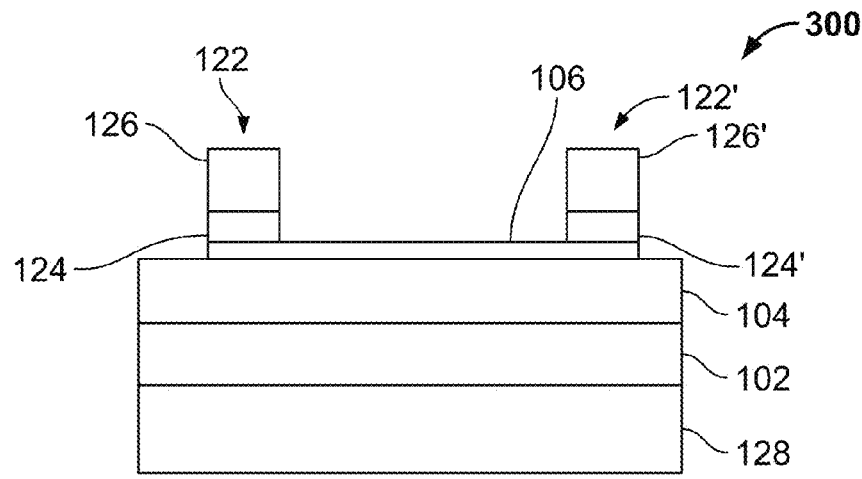
FIGS. 3B and 3C depict a cross-sectional view of the antenna-assisted photovoltaic graphene detector in FIG. 3A as well as the band alignment of the graphene beneath the metal contact and in the antenna gap.
Figure 3B:
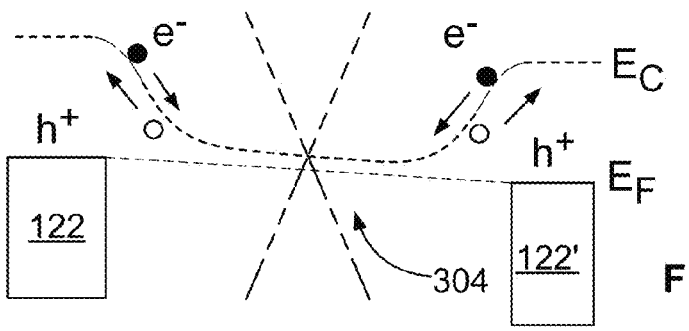

FIG. 3B depicts a cross section of antenna-assisted photovoltaic graphene detector 300 with metal layers 124, 124' both made of palladium. In FIG. 3B, antenna-assisted photovoltaic graphene detector 300 includes silicon layer 128, not shown in FIG. 3A. The inset to FIG. 3B depicts band alignment of the graphene beneath antenna electrodes 122, 122' and in antenna gap 304 when metal layers 124, 124' are both palladium. In some implementations, the graphene layer underneath antenna electrodes 122, 122' is p-type doped. Under light illumination, the generated photocurrents due to the built-in potential close to the two contacts have opposite signs, as indicated by the arrows in the inset. As such, the detector must be biased to generate a finite photocurrent.

Figure 3C:
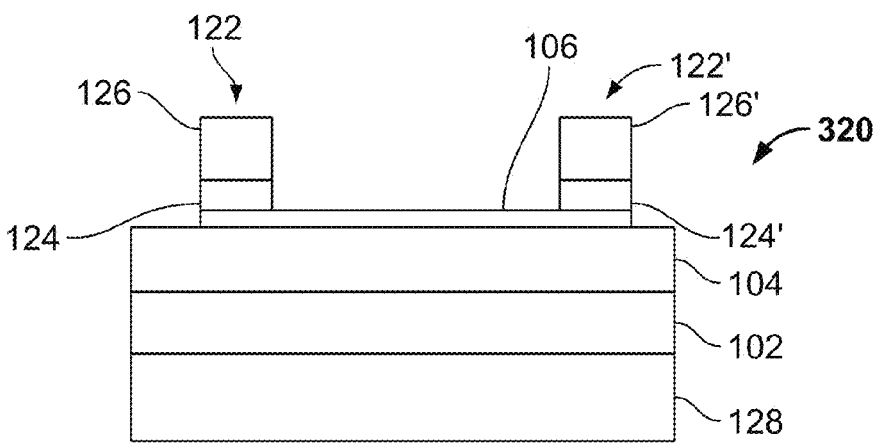
Figure 3C:
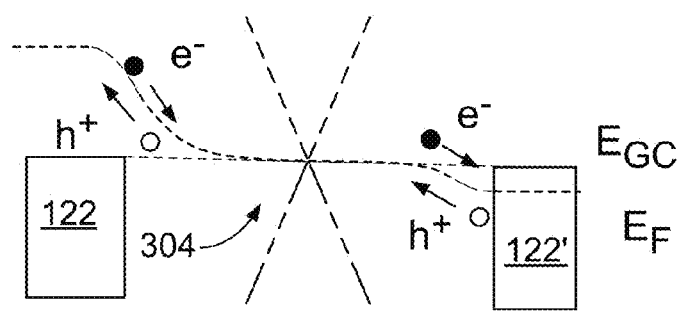

FIG. 3C depicts a cross section of antenna-assisted photovoltaic graphene detector 320 with metal layers 124, 124' made of palladium and titanium, respectively. The inset to FIG. 3C depicts band alignment of the graphene beneath antenna electrodes 122, 122' and in antenna gap 304 when metal layers 124, 124' are palladium and titanium, respectively. Arrows indicate the photocarrier diffusion direction. The titanium contact leads to n-type doping in the graphene underneath. As shown in the inset, the photocurrents generated adjacent to antenna electrodes 122, 122' have the same sign, resulting in photovoltaic response without requiring an external bias. A built-in potential of 60 meV between the Pd/Au and Ti/Au electrodes was extracted based on the experimental results. Metallic optical antennas, a counterpart of radio frequency (RF) antennas in the optical wavelength range, instead of the metal stripes, are used as the electrodes to achieve higher photocarrier collection efficiency without decreasing optical absorption in graphene. The use of boron nitride rather than silicon dioxide as a substrate may improve transport properties, including one order of magnitude higher graphene mobility. Compared to a photoconductor design in which both electrodes are palladium, as depicted in FIG. 3B, the asymmetric metallization scheme creates a built-in potential to collect photocarriers created in the graphene channel between antenna electrodes 122, 122'.

The internal quantum efficiency can be obtained by $G=2\tau_R/\tau_{tr}$, in which the carrier recombination time $\tau_R \approx 0.23$ ps (extracted from experimental results from a CVD graphene sample). The carrier transit time $\tau_{tr}$ across the graphene channel between the two electrodes (channel length g) can be calculated by $\tau_{tr}=g/v_d$, where $v_d$ is the drift velocity. Assuming a saturation velocity of $5.5\times10^5$ m/s at low carrier density, the drift velocity is approximated by a velocity saturation model, i.e., $$v_d = \mu E \bigg/ \left(1 + \frac{\mu E}{v_d}\right).$$

Figure 3D:
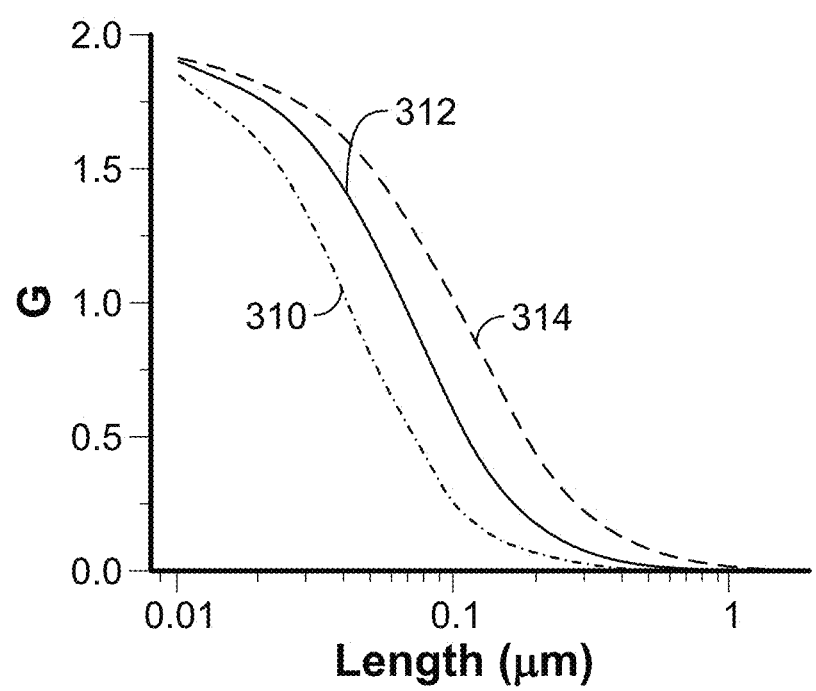
FIG. 3D shows the internal quantum efficiency for different carrier mobilities as a function of graphene channel length.

The electrical field E in the graphene channel inside the gap is determined by the built-in potential, i.e., $E=V_{IN}/g$. Plots 310, 312, and 314 in FIG. 3D show internal quantum efficiency for carrier mobilities of 1000 cm$^2$/Vs, 3000 cm$^2$/Vs, and 10,000 cm$^2$/Vs, respectively, as a function of graphene channel length in photodetector 300, assuming a built-in potential of 0.1 V across the graphene channel. These plots show that high internal quantum efficiency relies at least in part on high graphene mobility and a short graphene channel length. The graphene channel length between the antenna electrodes can be very short, even below 100 nm. The free space light is collected by the optical antennas and focused into the nanoscale gaps between them, where the optical absorption in graphene can be greatly enhanced due to the strong near field enhancement.

Figure 4A:
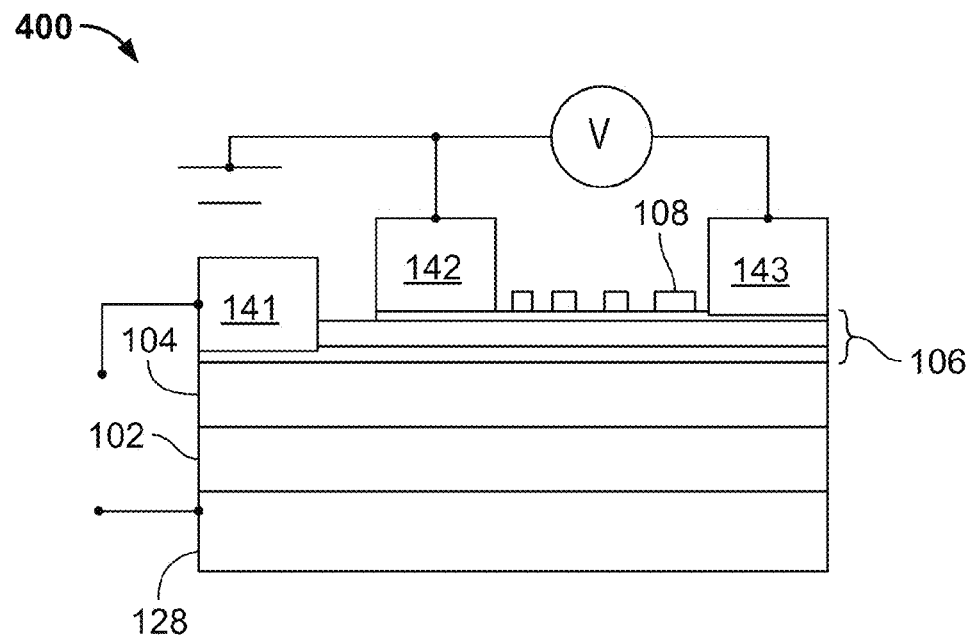
FIG. 4A depicts an antenna-assisted photovoltaic graphene detector.
Figure 4B:
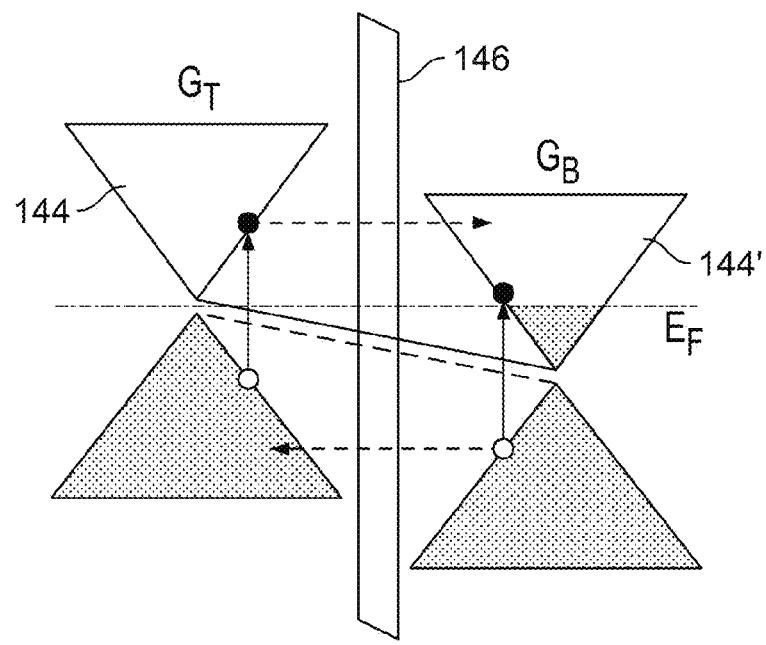
FIG. 4B depicts a band diagram of a graphene heterostructure, showing spatial separation of electrons and holes.

FIG. 4A depicts a cross section of antenna-assisted photovoltaic graphene detector 400, with silicon layer 128, metal layer 102, dielectric layer 104, graphene heterostructure 106, array of antenna electrodes 108, gate electrode 141, drain electrode 142, and source electrode 143. FIG. 4B depicts a band diagram of the graphene heterostructure (graphene/boron nitride/graphene or graphene/molybdenum disulfide/graphene) of antenna-assisted photovoltaic graphene detector 400, with graphene layers 144, 144' and barrier layer 146, showing spatial separation of electrons and holes. The barrier height can be engineered by choosing different materials for the barrier layer (boron nitride or molybdenum disulfide) and changing the number of layers (e.g., of molybdenum disulfide).

Artificial heterostructures assembled from van der Waals materials are thought to combine materials without the traditional restrictions in heterostructure growth such as lattice matching conditions and atom interlayer-diffusion. Because the interaction between planes is very weak, only small changes in the electronic structure are expected by stacking these materials on top of each other. The carrier tunneling process in heterostructures formed by graphene and other two-dimensional materials, such as boron nitride and molybdenum disulfide, is exploited to realize MIR photodetectors. FIG. 4A shows the schematic of such a device, and FIG. 4B shows the band structure alignment in the graphene heterostructure, including two single layer graphene sheets with a barrier layer in between. An electrical field across the barrier layer is created and controlled by changing the Fermi levels (i.e., doping concentrations, in the top and bottom graphene layers). The photo-generated carriers are separated by this built-in electrical field via tunneling through the barrier. Therefore, the carrier recombination lifetime TR is greatly enhanced, and as a result, the internal quantum efficiency ($G=\tau_R/\tau_{tr}$) is increased. The photocarrier separation effect is dependent on the tunneling rate between the two graphene layers and the photocarrier recombination rate in the graphene layer. Based on a theoretical model of coherent tunneling, the tunneling rate can be estimated by the coupling strength between the two graphene layers, which is dependent on the barrier height and thickness.

Boron nitride (BN) and molybdenum disulfide ($MoS_2$), which have different band gaps, are used in different layer thicknesses. For a single layer of BN used as the barrier, the coupling strength is estimated to be $2\hbar\Omega \sim 10$ meV and the tunneling rate is $R_{TB}=2\Omega^2\tau$, where $\tau$ is the carrier relaxation time in graphene ($\tau \approx 30$ fs, extracted from transport measurement of CVD graphene samples). Thus, the tunneling rate is $\sim 3\times 10^{12}$ s$^{-1}$, which is fast enough to separate more than 25% photogenerated electrons and holes in the graphene before they recombine (photocarrier lifetime $\tau_R \approx 0.23$ ps). Integration of graphene heterostructures with plasmonic metasurfaces, as depicted, for example, in FIG. 4A, yields graphene detectors with high absorption (>90%), low noise, and high carrier collection efficiency. Photodetection gain can also be achieved, for example, when the carrier lifetime in the top graphene layer is longer than the transit time ($\tau_{tr}>1$ ps) across the graphene channel between the antenna electrodes. High carrier collection efficiency and photodetection gain due to a long carrier recombination lifetime contribute to high internal quantum efficiency.

The detector responsivity is calculated as $$R_A = G\frac{e\alpha}{h\upsilon}.$$

Figure 5:
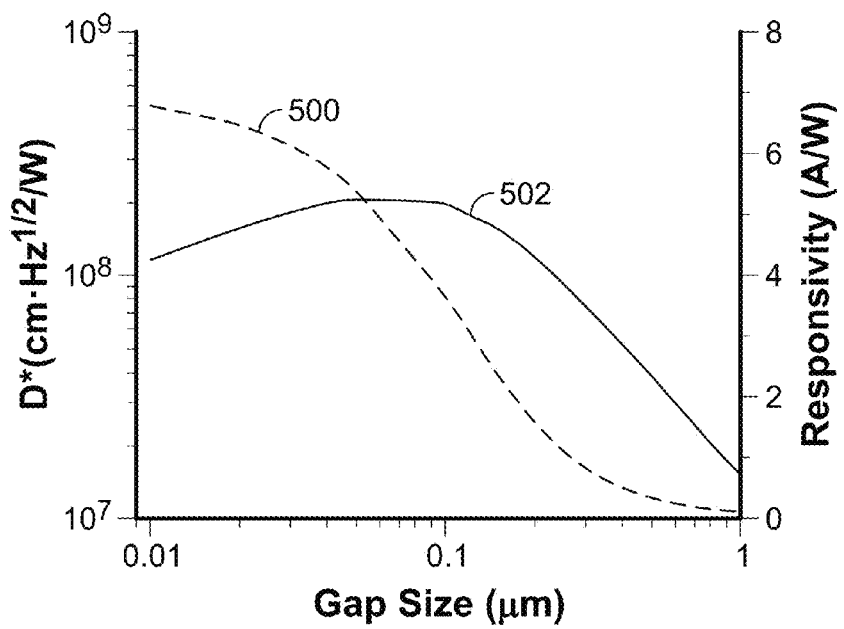
FIG. 5 shows detectivity and responsivity versus gap size for an antenna-assisted photovoltaic graphene detector.

The noise current at zero-bias and in absence of signal light radiation is $$i_N^2 = 4ei_D B + \frac{4kT}{R_o}B,$$

where the first term represents the shot noise and the second term represent the thermal noise, respectively. B is the detector bandwidth. At zero external bias, the thermal noise can be estimated to be $$i_N^2 = \frac{4kT}{R_0}B,$$

where $R_G$ is the graphene detector resistance. The noise equivalent power (NEP) and detectivity D* can be calculated as $$NEP = \sqrt{i_N^2}\bigg/\left(R_A\sqrt{B}\right)$$

and D*=√A/NEP, respectively (A is the detector area). The responsivity and detectivity (D*) of the antenna-assisted photovoltaic graphene detector 300 are calculated around wavelength $\lambda_0=8$ μm and shown as plots 500 and 502, respectively, in FIG. 5. The detectivity reaches its maximum (>$2\times10^8$ cmHz$^{1/2}$/W) when the antenna gap size is around 50~100 nm. The detector performance can be further improved by methods such as increasing carrier recombination lifetime by improving graphene quality or via carrier separation in graphene heterostructures as discussed above; improving the graphene mobility; further enhancing the optical absorption in graphene (up to >90%); and achieving photodetection gain as discussed above with respect to graphene heterostructures.

Models that can be used for photodetector device modeling include a closed analytical model and a three-dimensional numerical model of antenna-assisted photovoltaic graphene detectors based on the finite element method (COMSOL). The analytical model is sufficient to obtain general trends for improving device performance, for example, when combined with full wave optical simulation results, e.g., the antenna gap size and the carrier mobility.

Figure 6:
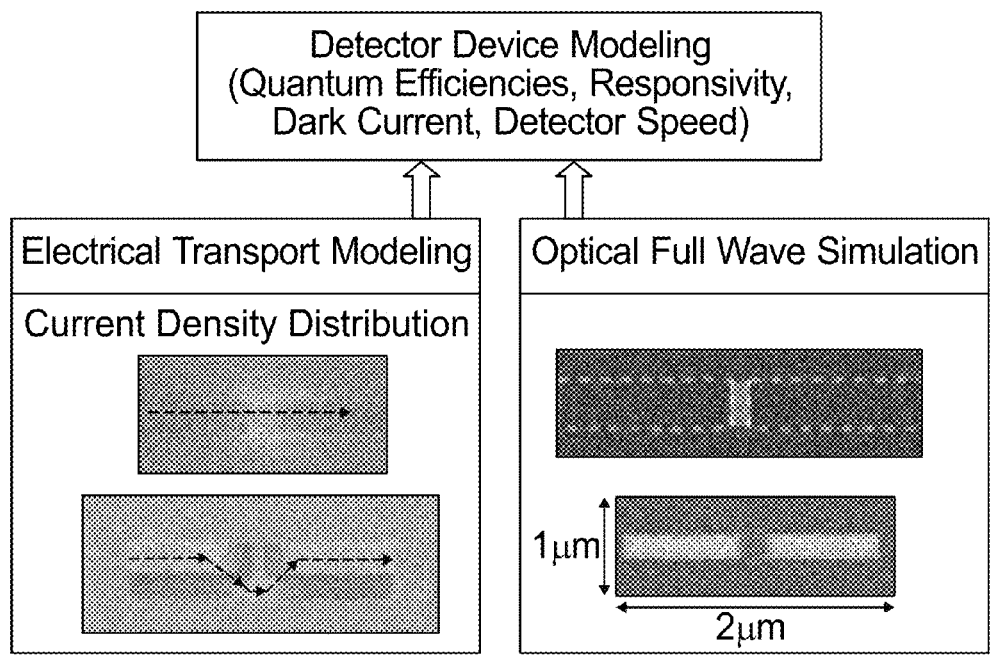
FIG. 6 depicts a comprehensive detector device model including both electrical and optical behaviors.

To obtain a more accurate prediction of the device performance, a 3D numerical model based on finite element method (FEM, COMSOL Inc. http://www.comsol.com/) can be used. A model with COMSOL is used to simulate the electrical transport behavior of the antenna-assisted graphene detectors. The simulated current density distribution in a portion of the graphene-antenna structure for a bias voltage $V_{DS}=0.2$ V and a gate voltage $V_G=5$ V is shown in FIG. 6 (bottom left panel). The current density distribution clearly shows that the current flows from one antenna to the graphene in the gap and then to the next antenna, as indicated by the dash-dotted arrows on the cross-sectional view. This configuration has been justified by comparing the simulation results for the graphene sample and the measurement results, which gives a deviation of less than 5%. To build a comprehensive model for the graphene PV detector, the electrical transport model is integrated with the optical model, as illustrated in FIG. 6 (bottom right panel). The device model includes the built-in potential distribution, the spatial distribution of the generated photocarrier concentrations as well as the carrier dynamics in graphene, and provides results for detector quantum efficiencies, responsivity, dark current, and detector response time.

Antenna-assisted photovoltaic graphene detectors described herein may be fabricated on a silicon wafer. In one example, fabrication includes evaporation of an aluminum layer (e.g., about 300 nm thick) onto the top surface of the silicon wafer, followed by atomic layer deposition (ALD) of a dielectric layer, such as an aluminum oxide (AlOx) layer (e.g., 300-400 nm thick). A thin barrier layer (e.g., BN) may be transferred onto the dielectric layer, followed by the transfer of a monolayer or double-layer graphene sheet. Mechanically exfoliated thin layers of BN and chemical vapor deposition (CVD) grown monolayer or few layer BN (purchased from companies such as graphene-supermarket.com) are suitable. The graphene sheet is then transferred onto the dielectric layer or barrier layer. In one example, to make two different metal contacts, the antenna electrodes made with Pd/Au are first patterned on graphene, and the Ti/Au antenna electrodes are then fabricated. The metal electrodes may be fabricated by electron beam lithography (EBL), electron beam evaporation of Pd (or Ti) and 30 nm Au, and lift-off. In the second EBL step, alignment is required. An alignment error of ~30-50 nm is tolerable.

Figure 7A:
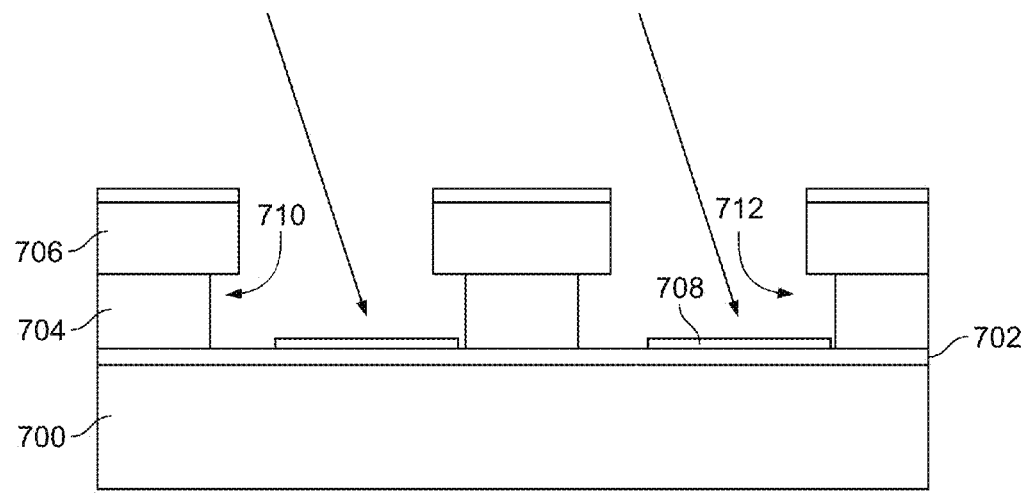
FIGS. 7A-7D depict formation of antenna electrodes with different metal contacts.

A self-aligned angle-deposition technique, such as that depicted in FIGS. 7A-7D, may be implemented. Angle deposition may be achieved, for example, by mounting a graphene heterostructure on a stage with an adjustable angle for metal evaporation. This technique exploits a double-layer poly(methyl methacrylate) (PMMA) which includes a low molecular weight PMMA (e.g., 495 k) at the bottom and a high molecular weight PMMA (e.g., 950 k) on the top. Other appropriate polymers may also be used. FIG. 7A depicts substrate 700 with graphene heterostructure 702 having low molecular weight PMMA layers 704 and high molecular weight PMMA layers 706 formed on the graphene heterostructure. The arrows indicate angle deposition of a first metal to yield first metal layer 708. After EBL exposure and development, undercuts 710 and 712 are formed in PMMA layers 704 due to the higher solubility of the lower molecular weight polymer in developers. Undercuts 710 and 712 facilitate liftoff and, in combination with angle deposition, allows the formation of two different metal contacts on the two sides of the graphene sheet, as described below with respect to FIGS. 7B-7D.

Figure 7B:
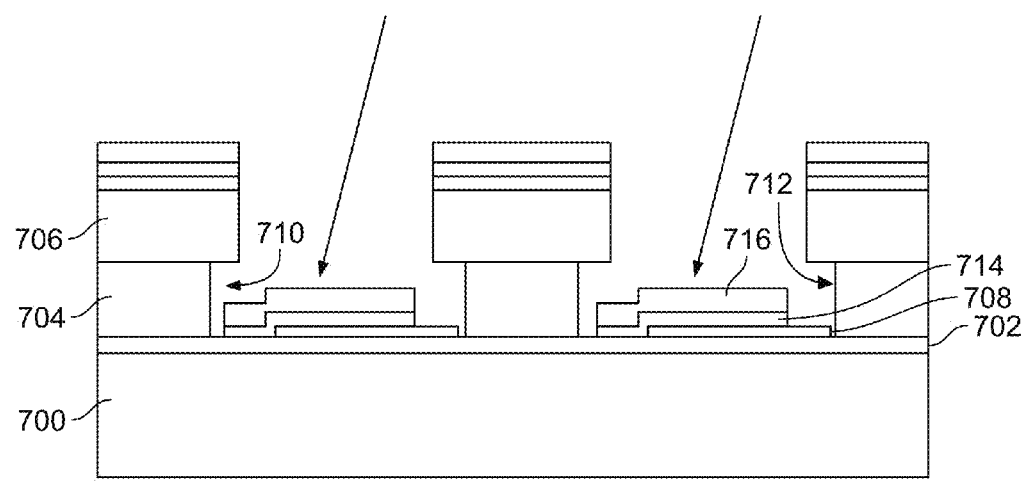
Figure 7C:
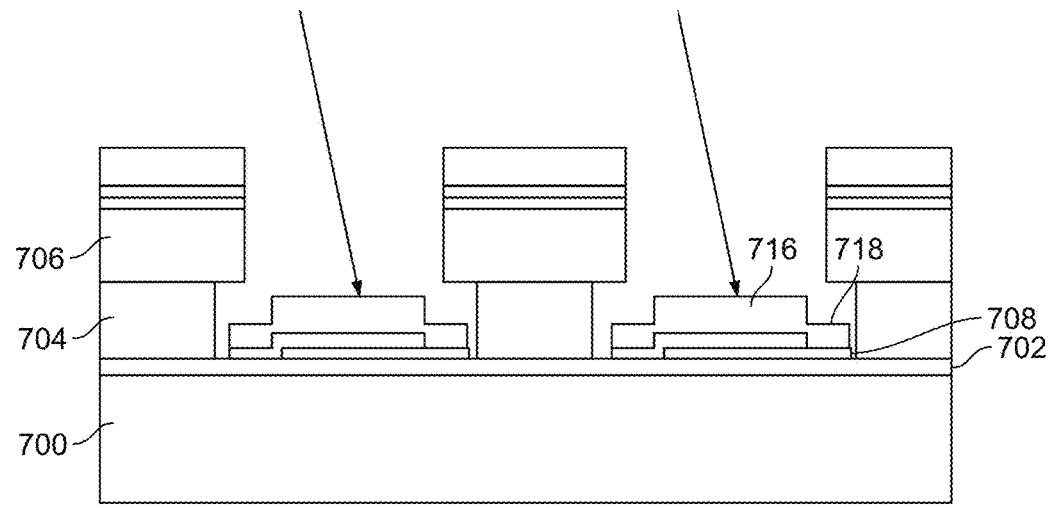

FIG. 7B depicts angle deposition of a second metal and then a third metal to yield second metal layer 714 on first metal layer 708 and graphene heterostructure 702 proximate cutout 710, and third metal layer 716 on second metal layer 714. FIG. 7C depicts angle deposition of the third metal to yield fourth metal layer 718 on first metal layer 708 proximate undercut 712 and to otherwise increase the thickness of third metal layer 716.

Figure 7D:
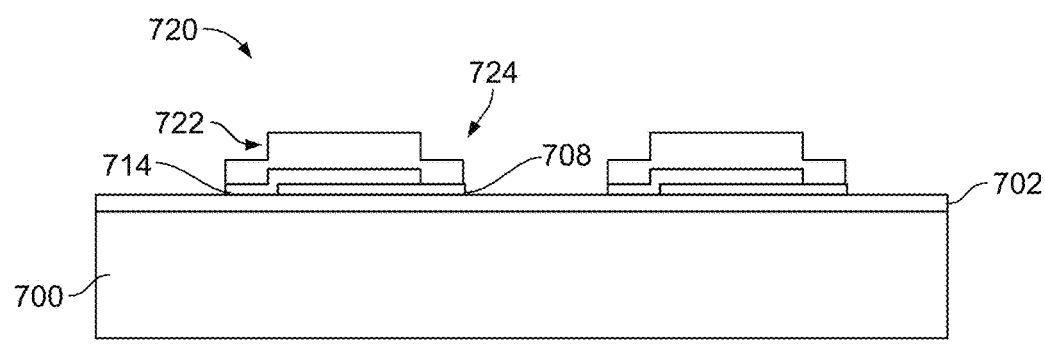
Figure 8:
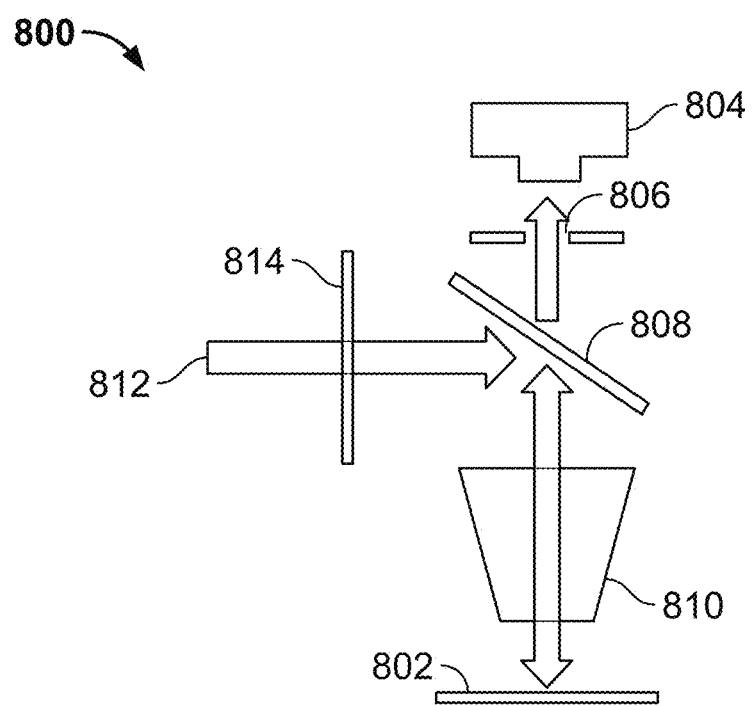
FIG. 8 depicts components in an optical characterization system.

In some implementations, the first metal is titanium or palladium, the second metal is titanium or palladium, and the third and fourth metals are gold. When the first metal is different from the second metal (e.g., the first metal is palladium and the second metal is titanium), the three angle-evaporation steps depicted in FIGS. 7A-7C result in the formation of different metal contacts (Ti or Pd) at the two ends of one antenna electrode. FIG. 7D depicts antenna electrodes 720 having first region 722, in which second metal layer 714 is in contact with graphene heterostructure 702, and second region 724, in which first metal 708 is in contact with the graphene heterostructure. After the antenna structures are patterned, the contact pads are fabricated with EBL or photolithography for wire bonding.

Antenna-assisted photovoltaic graphene detectors can be characterized with a MIR laser scanning photovoltage mapping setup, with the samples mounted on a two-dimensional motorized stage. The output of quantum cascade (QC) lasers (based on a broadband laser design, wavelength $\lambda_0$=7-13 µm) is focused onto the sample by a MIR microscope objective. This is introduced based on the closeness of the detector area (~10×10 µm$^2$) to the diffraction limit. Incoherent broadband MIR sources typically cannot provide such a small beam size. The local photovoltage response of larger area detectors may be measured by scanning the position of the focused laser beam on the sample with a spatial resolution of ~2 µm to determine device uniformity.

Device characterization results include optical measurement, detector responsivity, dark current, and detector noise. Depicts optical characterization setup 800 for characterization of sample 802. Optical characterization setup 800 includes detector 804, aperture 806, beam splitter 808, objective 810, Fourier transform infrared spectrometer 812, and polarizer 814. Experimental results may be compared with simulation results obtained by the graphene detector model to extract the photocarrier collection efficiency and to characterize the built-in potential introduced by antenna electrodes with different metal contact layers.

Figure 9A:
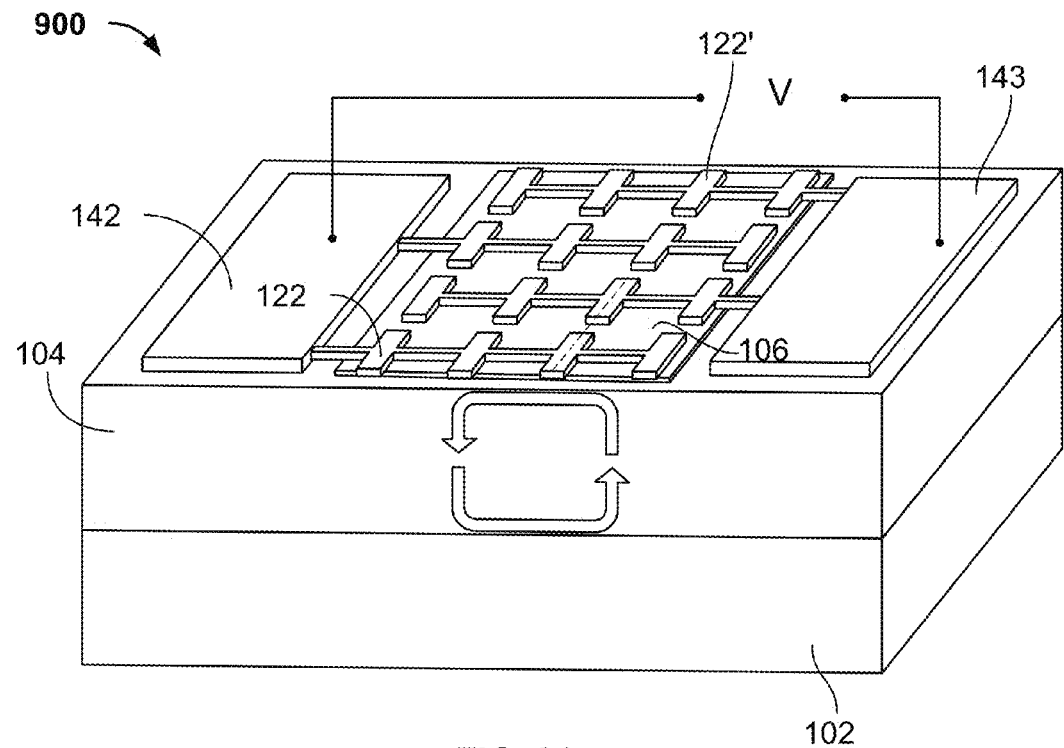
FIG. 9A depicts a graphene-metasurface photovoltaic detector.
Figure 9B:
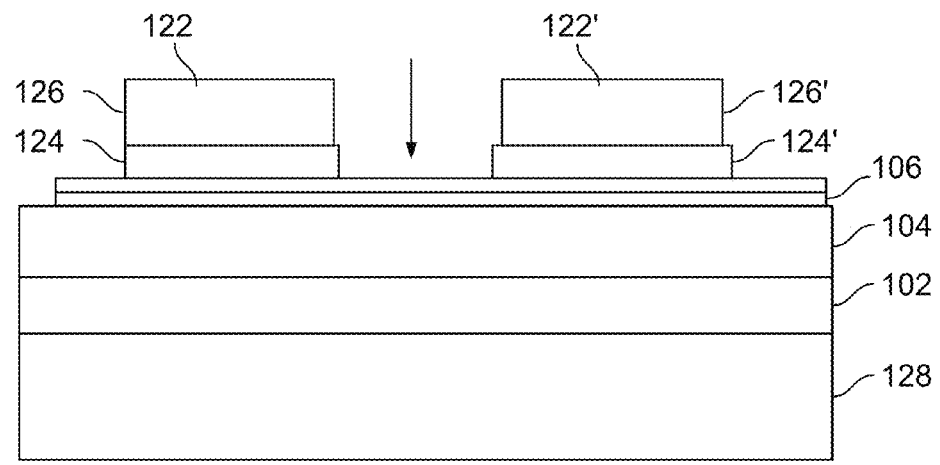
FIG. 9B depicts a cross-sectional view of the detector in FIG. 9A.
Figure 9C:
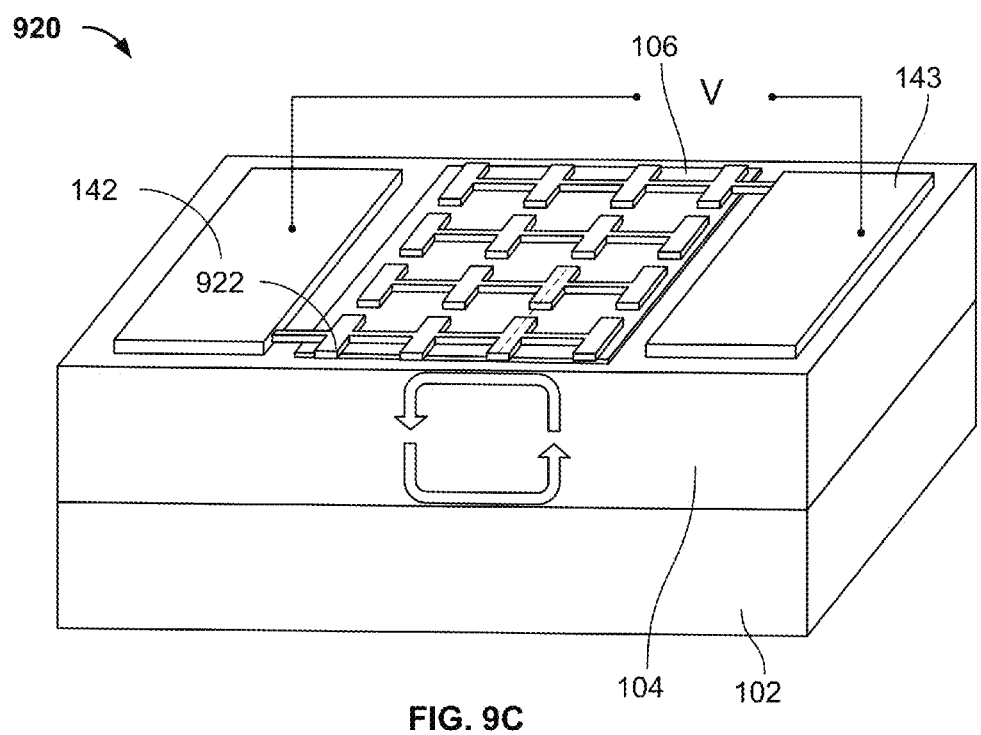
FIG. 9C depicts an antenna-assisted photovoltaic graphene detector with two types of metal contacts on the ends of each antenna.

Two types of graphene-metasurface detectors are shown in FIGS. 9A and 9C. FIG. 9A depicts detector 900 with metal layer 102, dielectric layer 104, graphene heterostructure 106, drain electrode 142, and source electrode 143. Antenna electrodes 122, 122' are formed on graphene heterostructure 106. Graphene heterostructure 106 includes a graphene layer on a barrier layer (e.g., boron nitride). Dielectric layer 104 is formed on metal layer 102. FIG. 9B depicts a cross section of detector 900 along the dashed line in FIG. 9A. Antenna electrodes 122, 122' include first metal layers 124, 124', respectively, in contact with graphene heterostructure 106, and second metal layers 126, 126', respectively, in contact with first metal layers 124, 124'. In one implementation, first metal layers 124, 124' are palladium and titanium, respectively, and second metal layers 126, 126' are gold. Drain electrode 302 and source electrode 302' may also have a first metal layer of palladium and titanium, respectively, and second metal layers of gold. When light illuminates antenna electrodes 122, 122', the generated photocurrent flows from antenna electrode 122' to antenna electrode 122. Antenna electrodes 122 have the same type of metallization and are connected to drain electrode 302. Antenna electrodes 122' have the same type of metallization and are connected to source electrode 302'.

Figure 9D:
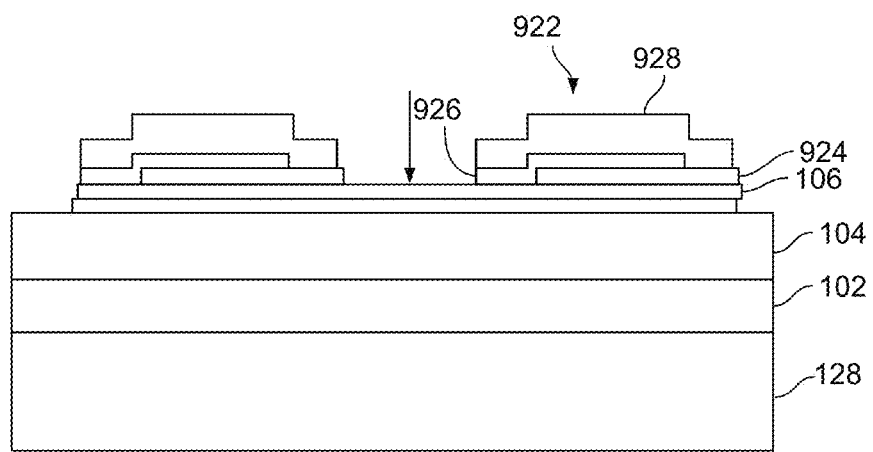
FIG. 9D depicts a cross-sectional view of the detector in FIG. 9C.

FIG. 9C depicts detector 920. Antenna electrodes 922 are formed by a process such as that described with respect to FIGS. 7A-7D, such that the contact layer on opposite sides of a single antenna electrode are formed of different metals. Drain electrode 142 and source electrode 143 may be the same. FIG. 9D depicts a cross section of detector 920 along the dashed line in FIG. 9C. Antenna electrodes 922 include first metal layer 924, second metal layer 926, and third metal layer 928. In first portion 930, first metal layer 924 is in contact with graphene heterostructure 106, and third metal layer 928 is formed over first metal layer 924. In second portion 930', second metal layer 926 is in contact with graphene hetero structure 106, and third metal layer 928 is formed over second metal layer 926 and part of first metal layer 924. That is, detector 920 has a first metal contact layer on a first side of antenna electrode 922, and a second metal contact layer on a first side of antenna electrode 922. The first and second metals may be different (e.g., titanium and palladium). When the first and second metals are titanium and palladium, the generated photocurrent in each nanoantenna gap will flow from the antenna end with titanium contact to the palladium contact of the adjacent antenna. To collect all the photocarriers generated, the structures are designed with the first row and the last row of the antenna array connected to the two contact pads, respectively. One advantage of this design is that it can be fabricated by angle deposition techniques to avoid the requirement of accurate alignment during the nanofabrication process.

In the detectors depicted in FIGS. 9A and 9C, the graphene heterostructure may include a boron nitride layer underneath a graphene layer to improve the graphene quality. Higher graphene quality (i.e., higher carrier mobility) promotes high performance photodetectors, because it does not only affect the photocarrier recombination lifetime but also influences the drift velocity of photocarriers in the graphene detection channel. Graphene on boron nitride substrates typically demonstrate better transport properties than graphene on silicon oxide, with carrier mobility (for both electrons and holes) increased by almost an order of magnitude (>10,000 cm$^2$/Vs).

The antenna electrodes in detectors 900, 920 are connected to the drain and source electrodes via thin metal wires. The metal wires do not interfere with antenna resonance so that the optical response of detector does not change significantly, and perfect absorption can be achieved by small adjustment of the design parameters, such as antenna length and the thickness of the dielectric layer (aluminum oxide). According to full wave simulation, the maximum optical absorption in single and double layer graphene can be more than 50% and 70%, respectively.

In detectors 900 and 920, the RC time constant is estimated to be $\tau_{RC} \approx 50$ ps, assuming the load resistance is 50Ω and the area of the contact pads is $10^4$ μm$^2$. Besides the RC time constant, other factors may affect the response time of graphene photodetectors, for example, the photocarrier recombination time in graphene ($\tau_R$), and the carrier transit time across the graphene channel between the two antenna electrodes ($\tau_{tr}$). The carrier recombination time in graphene is ~1 ps or shorter. The carrier transit time $\tau_{tr}$ is also shorter than 1 ps for a built-in potential of 60 meV over a 100 nm-long graphene channel. Therefore, in graphene detectors, the RC time limited bandwidth is estimated to be $f_T = 3.5/2\pi\tau_{RC} \approx 10$ GHz. The detector bandwidth can be further improved by increasing the dielectric thickness underneath the contact pad and thus reducing the parasitic capacitance.

Figure 10A:
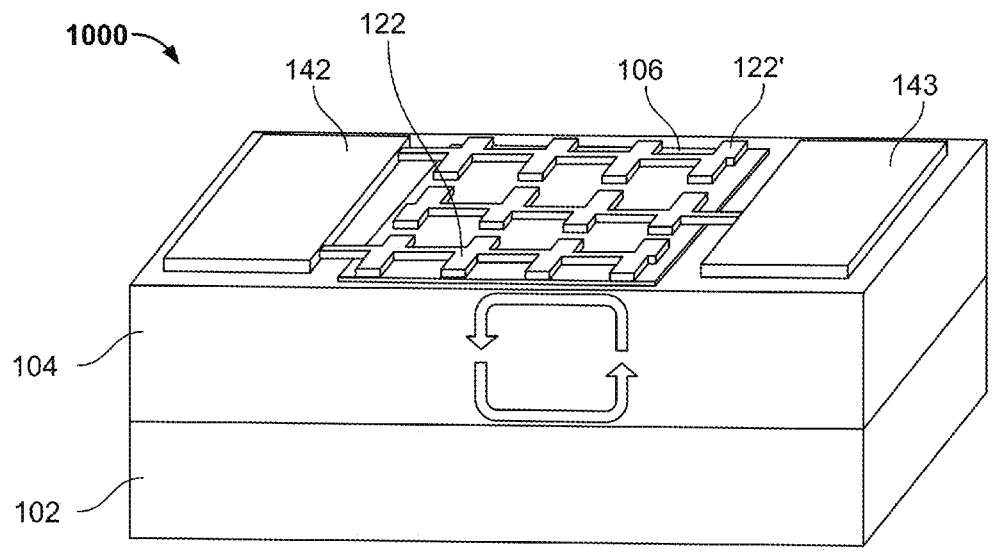
FIG. 10A depicts an antenna-assisted photovoltaic graphene detector.
Figure 10B:
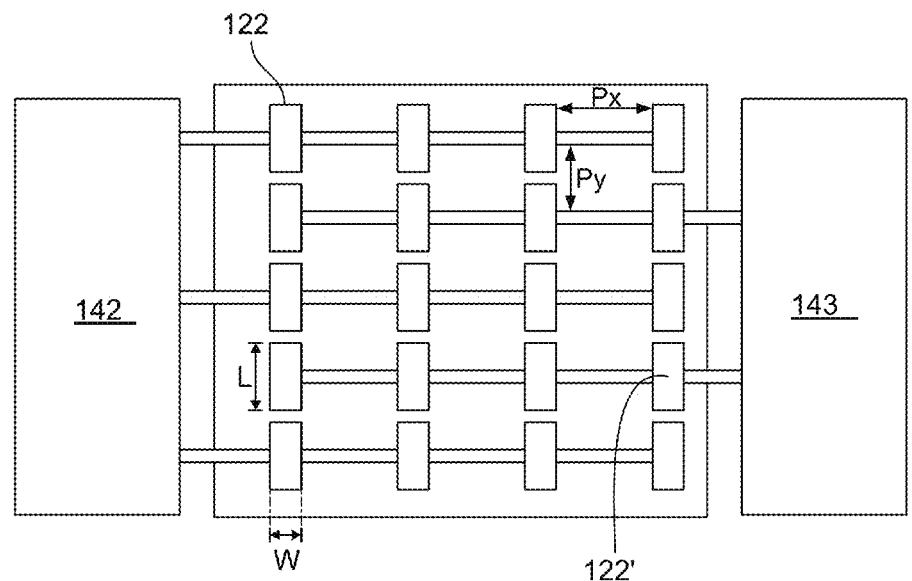
FIG. 10B depicts a top view of the detector in FIG. 10A.

Graphene-metasurface photodetectors described herein are applicable to the whole MIR wavelength region (e.g., 3-24 μm). FIG. 10A depicts graphene-metasurface photodetector 1000 with drain electrode 142, source electrode 143, and graphene heterostructure 106 formed on dielectric layer 104. Antenna electrodes 122, 122' are formed on graphene heterostructure 106. Graphene heterostructure 106 includes a graphene layer on a barrier layer (e.g., boron nitride). Dielectric layer 104 is formed on metal layer 102. FIG. 10B depicts a top view of detector 1000, where $P_x$ denotes a distance between antenna electrodes in a row of antenna electrodes 122, and $P_y$ denotes a distance between graphene channels in adjacent rows of antenna electrodes 122, 122'. For an implementation in which the contact layers in drain electrode 142 and source electrode 143 are palladium and titanium, respectively, dielectric layer 104 is a 400 nm layer of aluminum oxide, and metal layer 102 is a 300 nm layer of aluminum, antenna length (L), antenna width (W), antenna thickness (T), $P_x$, and $P_y$ may be selected to achieve various wavelengths in the range of 6-8.25 μm, as shown in Table 1. For each of the examples in Table 1, antenna thickness is in a range of 40-100 nm.

TABLE 1

Design parameters for detector wavelength

| Wavelength (μm) | L (μm) | W (nm) | $P_x$ (μm) | $P_y$ (μm) |
|---|---|---|---|---|
| 6 | 1.2 | 100 | 1.6 | 2 |
| 6.5 | 1.3 | 100 | 1.6 | 2 |
| 7 | 1.4 | 100 | 1.6 | 2 |
| 7.5 | 1.6 | 100 | 1.6 | 2.2 |
| 8.25 | 1.8 | 100 | 1.6 | 2.2 |

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A mid-infrared photovoltaic photodetector comprising:
a substrate;
a graphene layer;
a dielectric layer positioned between the substrate and the graphene layer;
one or more first antenna electrodes, wherein each of the one or more first antenna electrodes comprises a first metal in direct contact with the graphene layer;
one or more second antenna electrodes, wherein each of the one or more second antenna electrodes comprises a second metal in direct contact with the graphene layer;
a drain electrode electrically coupled to the one or more first antenna electrodes; and
a source electrode electrically coupled to the one or more second antenna electrodes,
wherein:
the first metal and the second metal have different work functions,
the one or more first antenna electrodes and the one or more second antenna electrodes are optical antenna electrodes configured to absorb in the mid-infrared spectral region,
one of the one or more first antenna electrodes is separated from one of the one or more second antenna electrodes by a distance of 100 nm or less across the graphene layer, and the distance defines a graphene channel between the one of the one or more first antenna electrodes and the one of the one or more second antenna electrodes.

2. The photovoltaic photodetector of claim 1, wherein the substrate comprises a metal.

3. The photovoltaic photodetector of claim 2, further comprising a host layer, wherein the substrate is positioned between host layer and the dielectric layer.

4. The photovoltaic photodetector of claim 1, wherein the dielectric layer comprises aluminum oxide or silicon oxide.

5. The photovoltaic photodetector of claim 1, further comprising a barrier layer between the graphene layer and the dielectric layer, wherein the barrier layer comprises boron nitride or molybdenum disulfide.

6. The photovoltaic photodetector of claim 5, wherein the graphene layer is a first graphene layer, and further comprising a second graphene layer in contact with the barrier layer, wherein the second graphene layer is in direct contact with the dielectric layer.

7. The photovoltaic photodetector of claim 1, wherein the first metal comprises palladium or titanium.

8. The photovoltaic photodetector of claim 1, wherein the second metal comprises palladium or titanium.

9. The photovoltaic photodetector of claim 1, wherein the each of the one or more first antenna electrodes and each of the one or more second antenna electrodes comprises the first metal in direct contact with the graphene layer and the second metal in direct contact with the graphene layer.

10. The photovoltaic photodetector of claim 1, wherein each of the one or more first antenna electrodes comprises a third metal in contact with the first metal and each of the one or more second antenna electrodes comprises a fourth metal in contact with the second metal.

11. The photovoltaic photodetector of claim 10, wherein the third metal and the fourth metal are the same.

12. The photovoltaic photodetector of claim 11, wherein the third metal is gold.

13. The photovoltaic photodetector of claim 1, wherein each of the one or more first antenna electrodes is adjacent one of the one or more second antenna electrodes.

14. The photovoltaic photodetector of claim 1, wherein the photodetector is operable over a wavelength region of 2 µm to 24 µm.

15. The photovoltaic photodetector of claim 1, wherein the sensitivity of the photodetector exceeds $2\times10^8$ cm-$Hz^{1/2}$/W.

16. The photovoltaic photodetector of claim 1, wherein a response time of the photodetector is 10 ns or less.

17. The photovoltaic photodetector of claim 1, wherein a thickness of the photodetector is less than 1 µm.

18. The photovoltaic photodetector of claim 1, wherein noise due to dark current is substantially zero.

* * * * *